(12) United States Patent
Kim et al.

(10) Patent No.: US 12,317,733 B2
(45) Date of Patent: May 27, 2025

(54) DISPLAY APPARATUS AND METHOD OF MANUFACTURING THE SAME

(71) Applicant: Samsung Display Co., Ltd., Yongin-si (KR)

(72) Inventors: Taekyu Kim, Yongin-si (KR); Kwangbok Kim, Yongin-si (KR); Wonhee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 435 days.

(21) Appl. No.: 17/750,818

(22) Filed: May 23, 2022

(65) Prior Publication Data
US 2022/0285659 A1    Sep. 8, 2022

Related U.S. Application Data

(62) Division of application No. 16/815,350, filed on Mar. 11, 2020, now Pat. No. 11,374,208.

(30) Foreign Application Priority Data

Mar. 13, 2019  (KR) ......................... 10-2019-0028859

(51) Int. Cl.
*H01L 35/24* (2006.01)
*B23K 26/06* (2014.01)
(Continued)

(52) U.S. Cl.
CPC ......... *H10K 71/00* (2023.02); *B23K 26/0608* (2013.01); *B23K 26/0624* (2015.10);
(Continued)

(58) Field of Classification Search
CPC .... H10K 71/00; H10K 50/8426; H10K 59/12; H10K 71/50; H10K 71/851;
(Continued)

(56) References Cited

U.S. PATENT DOCUMENTS 7,780,493 B2    8/2010    Choi et al.
7,862,396 B2    1/2011    Lee
(Continued)

FOREIGN PATENT DOCUMENTS

CN    101645403 A    2/2010
EP    1814185 A2    8/2007
(Continued)

OTHER PUBLICATIONS

Helie, David, et al. "Reinforced direct bonding of optical materials by femtosecond laser welding," Applied Optics, vol. 51, No. 12, Apr. 2012, pp. 2098-2106.

*Primary Examiner* — Theresa T Doan
(74) *Attorney, Agent, or Firm* — Womble Bond Dickinson (US) LLP

(57) ABSTRACT

A method of manufacturing a display apparatus includes: forming a plurality of displays including a light-emitting diode on a surface of a first mother substrate; preparing a second mother substrate; forming a first sealed area on a surface of at least one of the first mother substrate or the second mother substrate, wherein the first sealed area surrounds each of the plurality of displays and includes a frit; firstly bonding the first mother substrate to the second mother substrate by melting the frit in the first sealed area by radiating a first laser beam; and secondly bonding the first mother substrate to the second mother substrate by forming a second sealed area in which the frit and the first mother substrate, and/or the frit and the second mother substrate, are melted and mixed with each other by radiating a second laser beam partially in the first sealed area.

12 Claims, 9 Drawing Sheets

(51) Int. Cl.
*B23K 26/0622* (2014.01)
*B23K 26/211* (2014.01)
*H01L 51/00* (2006.01)
*H10K 50/842* (2023.01)
*H10K 59/12* (2023.01)
*H10K 71/00* (2023.01)
*H10K 71/50* (2023.01)

(52) U.S. Cl.
CPC ........ *B23K 26/211* (2015.10); *H10K 50/8426* (2023.02); *H10K 59/12* (2023.02); *H10K 71/50* (2023.02); *H10K 71/851* (2023.02)

(58) Field of Classification Search
CPC ........... H10K 59/8731; H10K 59/8722; H10K 71/421; H10K 59/87; H10K 59/1201; H10K 50/84; B23K 26/0608; B23K 26/0624; B23K 26/211
USPC .......................................................... 257/40
See application file for complete search history.

(56) References Cited

U.S. PATENT DOCUMENTS

| | | | |
|---|---|---|---|
| 8,154,198 | B2 | 4/2012 | Lee et al. |
| 8,292,684 | B2 | 10/2012 | Kim et al. |
| 8,299,705 | B2 | 10/2012 | Choi |
| 8,564,198 | B2 | 10/2013 | Kim et al. |
| 9,076,987 | B2 | 7/2015 | Huang et al. |
| 9,202,957 | B2 | 12/2015 | Shinohara |
| 9,748,515 | B2 | 8/2017 | Hong et al. |
| 9,793,082 | B2 | 10/2017 | Kim |
| 10,773,492 | B2 | 9/2020 | Song et al. |
| 2005/0285522 | A1 | 12/2005 | Han et al. |
| 2007/0171637 | A1 | 7/2007 | Choi |
| 2012/0104933 | A1 | 5/2012 | Jung et al. |
| 2012/0236587 | A1 | 9/2012 | Kim et al. |
| 2013/0011598 | A1 | 1/2013 | Kawanami et al. |
| 2013/0126938 | A1 | 5/2013 | Eberhardt et al. |
| 2014/0216645 | A1 | 8/2014 | Nakamura |
| 2019/0047251 | A1* | 2/2019 | Song .................. B32B 7/12 |
| 2019/0148475 | A1 | 5/2019 | Seo et al. |

FOREIGN PATENT DOCUMENTS

| | | |
|---|---|---|
| EP | 1944817 A2 | 7/2008 |
| JP | 2007-200839 | 8/2007 |
| JP | 2015-013760 A | 1/2015 |
| KR | 10-0711879 | 4/2007 |
| KR | 10-0838077 B1 | 6/2008 |
| KR | 10-0887368 B1 | 3/2009 |
| KR | 10-2010-0047585 A | 5/2010 |
| KR | 10-2016-0011309 | 2/2016 |
| KR | 10-2019-0018577 | 2/2019 |
| WO | WO 2012/073868 A1 | 6/2012 |

* cited by examiner

DISPLAY APPARATUS AND METHOD OF MANUFACTURING THE SAME

CROSS-REFERENCE TO RELATED APPLICATIONS

This application is a divisional of U.S. application Ser. No. 16/815,350, filed on Mar. 11, 2020, which claims priority to and the benefit of Korean Patent Application No. 10-2019-0028859, filed on Mar. 13, 2019 in the Korean Intellectual Property Office, the entire disclosures of both of which are incorporated herein by reference.

BACKGROUND

1. Field

Aspects of one or more embodiments relate to a display apparatus, and a method of manufacturing a display apparatus.

2. Description of the Related Art

An organic light-emitting display apparatus has a characteristic whereby it is degraded by penetration of moisture. Accordingly, when a sealing process for isolating an organic light-emitting diode from outside is performed during manufacture of the display apparatus, a frit having high internal pressure characteristics and excellent sealing characteristics is used.

For sealing using a frit, a laser may be used to greatly reduce a thermal effect on an organic light-emitting diode and melt the frit. However, when sealing is performed by using a laser, evenness in both a thickness of the frit and a bonding surface between the frit and the substrate may deteriorate. Thus, a problem such as generation of a crack in the bonding surface may occur.

SUMMARY

According to an aspect of one or more embodiments, a display apparatus of which a strength of an instrument is enhanced by improving a bonding characteristic of an area in which a crack is generated is provided. However, the embodiments described herein are only examples, and the scope of the present invention is not limited thereto.

Additional aspects will be set forth, in part, in the description which follows and, in part, will be apparent from the description, or may be learned by practice of the presented embodiments.

According to one or more embodiments, a method of manufacturing a display apparatus includes: forming a plurality of displays, each including a light-emitting diode on a surface of a first mother substrate; preparing a second mother substrate; forming a first sealed area on a surface of at least one of the first mother substrate or the second mother substrate, wherein the first sealed area surrounds each of the plurality of displays and includes a frit; firstly bonding the first mother substrate to the second mother substrate by melting the frit in the first sealed area by radiating a first laser beam; and secondly bonding the first mother substrate to the second mother substrate by forming a second sealed area in which the frit and the first mother substrate, and/or the frit and the second mother substrate are melted and mixed with each other by radiating a second laser beam partially to an inside of the first sealed area.

The first sealed area may include a first end arranged near or proximate each of the plurality of displays and a second end arranged far or distal from each of the plurality of displays, and a center of the second laser beam may move from a position nearer to the first end than to the second end along a path via which the second laser beam proceeds.

The center of the second laser beam may be between a point corresponding to ¼ of a width of the first sealed area from the first end and a point corresponding to ½ of the width of the first sealed area from the first end, and move along the path via which the second laser beam proceeds.

A width of the second laser beam may be less than a width of the first laser beam.

A frequency of the second laser beam may be higher than a frequency of the first laser beam.

The first laser beam may be a continuous wave laser beam.

The second laser beam may be a femtosecond laser beam.

The first sealed area may have a closed loop shape surrounding a periphery of the plurality of displays.

The second sealed area may be formed continuously in the first sealed area.

The second sealed area may be formed discontinuously in the first sealed area.

When the second sealed area is viewed from a surface vertical to a main surface of the first mother substrate, the second sealed area may be formed to include a portion protruding from a surface on which the frit is in contact with the first mother substrate toward the first mother substrate.

When the second sealed area is viewed from a surface vertical to a main surface of the second mother substrate, the second sealed area may be formed to include a portion protruding from a surface on which the frit is in contact with the second mother substrate toward the second mother substrate.

When the second sealed area is viewed from a surface vertical to a main surface of the first mother substrate, the second sealed area may be formed to include a portion protruding from a surface on which the frit is in contact with the first mother substrate toward the first mother substrate, and, when the second sealed area is viewed from a surface vertical to a main surface of the second mother substrate, the second sealed area may be formed to include a portion protruding from a surface on which the frit is in contact with the second mother substrate toward the second mother substrate.

The method may further include, after the secondly bonding the first mother substrate to the second mother substrate, cutting the first mother substrate or the second mother substrate for each of the plurality of displays.

The method may further include cutting the first mother substrate or the second mother substrate for each of the plurality of displays, wherein the secondly bonding the first mother substrate to the second mother substrate is performed on each of the plurality of cut and divided displays.

According to one or more embodiments, a display apparatus includes: a first substrate; a display arranged on the first substrate and including a light-emitting diode; a second substrate facing the first substrate; a first sealed area arranged between the first substrate and the second substrate, surrounding the display, and including a frit; and a second sealed area arranged in the first sealed area and including at least one portion protruding toward the first substrate and/or the second substrate.

The first substrate and/or the second substrate may include a glass material.

The first sealed area may have a closed loop shape surrounding a periphery of the display.

The first sealed area may include a first end arranged near or proximate the display, and a second end arranged far or distal from the display, and a center of the second sealed area may be nearer to the first end than to the second end.

The center of the second sealed area may be between a point corresponding to ¼ of a width of the first sealed area at the first end and a point corresponding to ½ of the width of the first sealed area at the first end.

A width of the second sealed area may be less than a width of the first sealed area.

The second sealed area may include an area in which materials of the frit and the first substrate, and/or materials of the frit and the second substrate are melted and mixed with each other.

The second sealed area may be formed continuously in the first sealed area.

The second sealed area may be formed discontinuously in the first sealed area.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
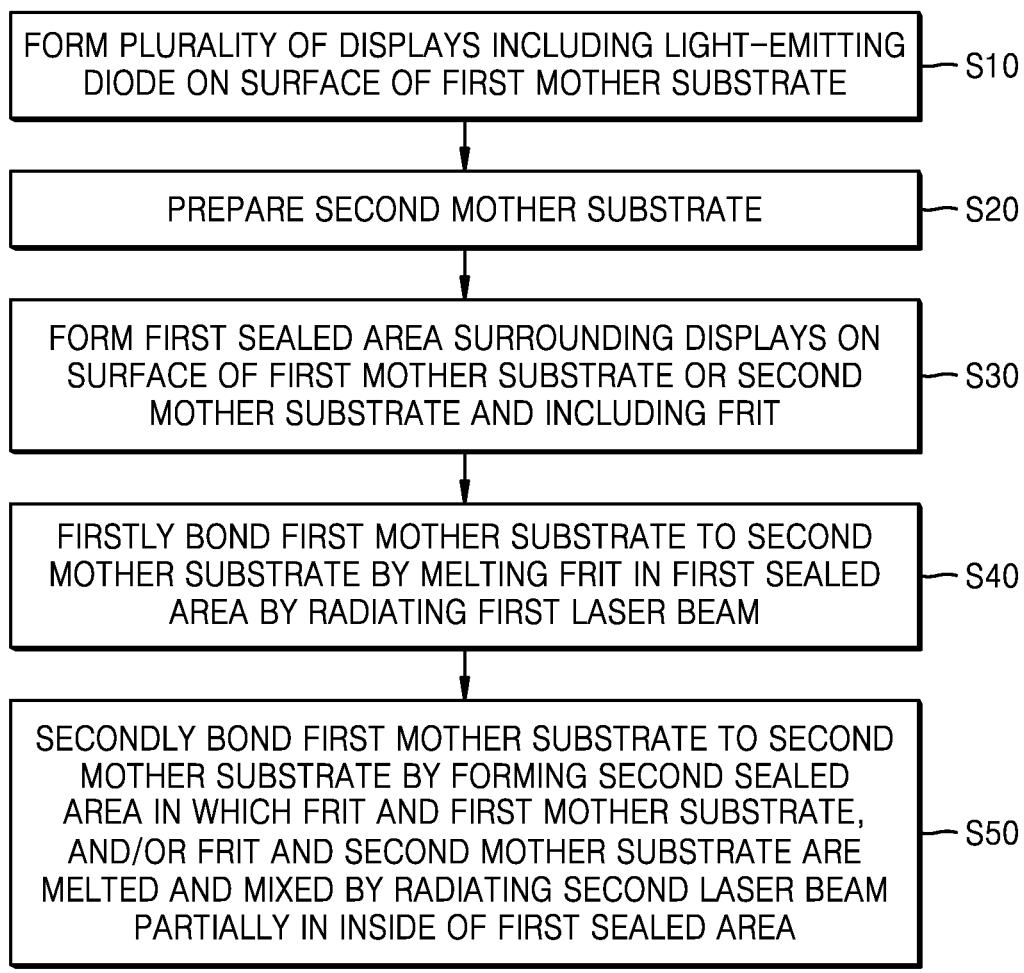
FIG. 1 is a schematic flowchart illustrating a method of manufacturing a display apparatus according to an embodiment.

Reference will now be made in further detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, some example embodiments will be illustrated in the drawings and described in further detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the example embodiments set forth herein.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

It is to be further understood that the terms "comprises," "comprising," "includes," and "including" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present. Further, for example, when a layer, region, or component is referred to as being electrically "connected to" or "coupled to" another layer, region, or component, it may be electrically directly connected or coupled to the other layer, region, or component, or electrically indirectly connected or coupled to the other layer, region, or component with one or more intervening elements therebetween.

When a certain embodiment may be implemented differently, a specific process order may be different from a described one. For example, two processes that are consecutively described may be performed substantially at the same time or performed in an order opposite to the described order.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic flowchart illustrating a method of manufacturing a display apparatus according to an embodiment.

Referring to FIG. 1, a method of manufacturing a display apparatus according to an embodiment includes forming a plurality of displays including a light-emitting diode on a surface of a first mother substrate (S10), preparing a second mother substrate (S20), forming a first sealed area surrounding the displays on a surface of the first mother substrate or the second mother substrate and including a frit (S30), firstly bonding the first mother substrate to the second mother substrate by melting the frit in the first sealed area by radiating a first laser beam (S40), and secondly bonding the first mother substrate to the second mother substrate by forming a second sealed area in which the frit and the first mother substrate, and/or the frit and the second mother substrate are melted and mixed by radiating a second laser beam partially to an inside of the first sealed area (S50).

Figure 2:
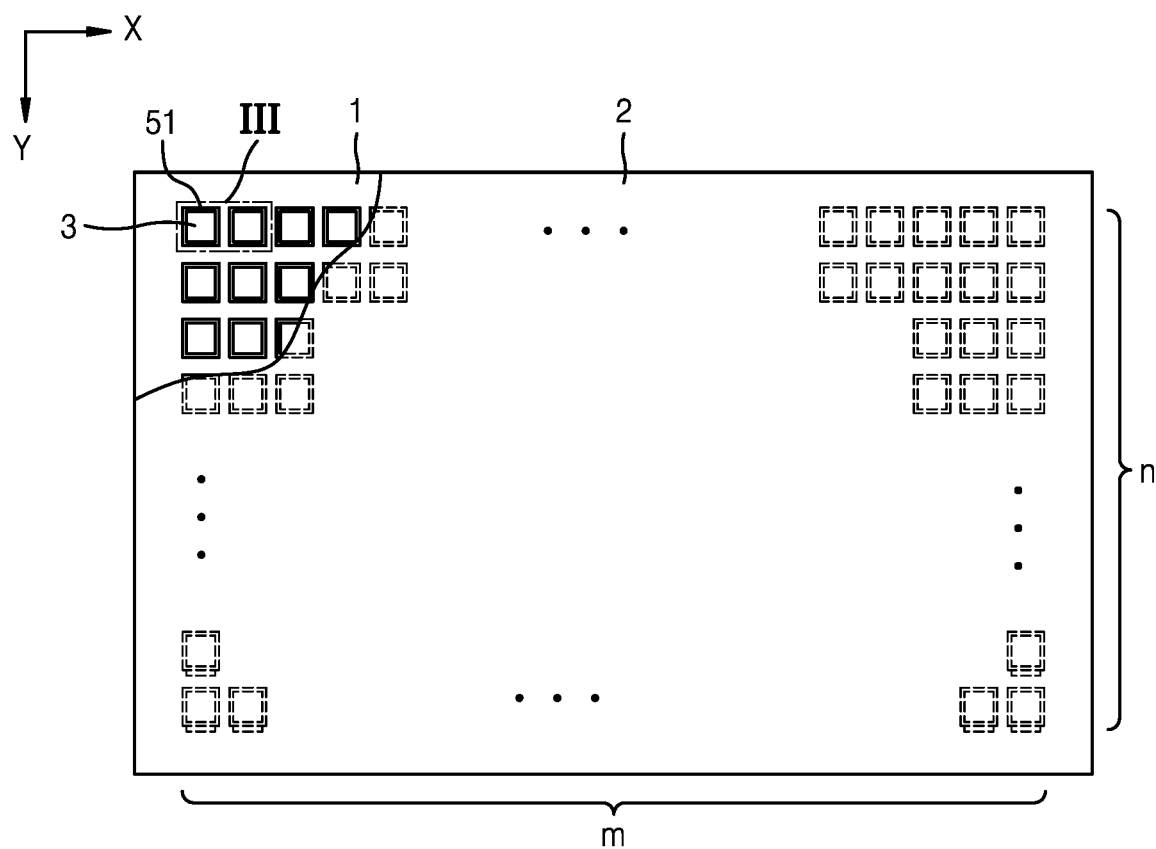
FIG. 2 is a schematic plan view illustrating a method of manufacturing a display apparatus according to an embodiment.
Figure 3A:
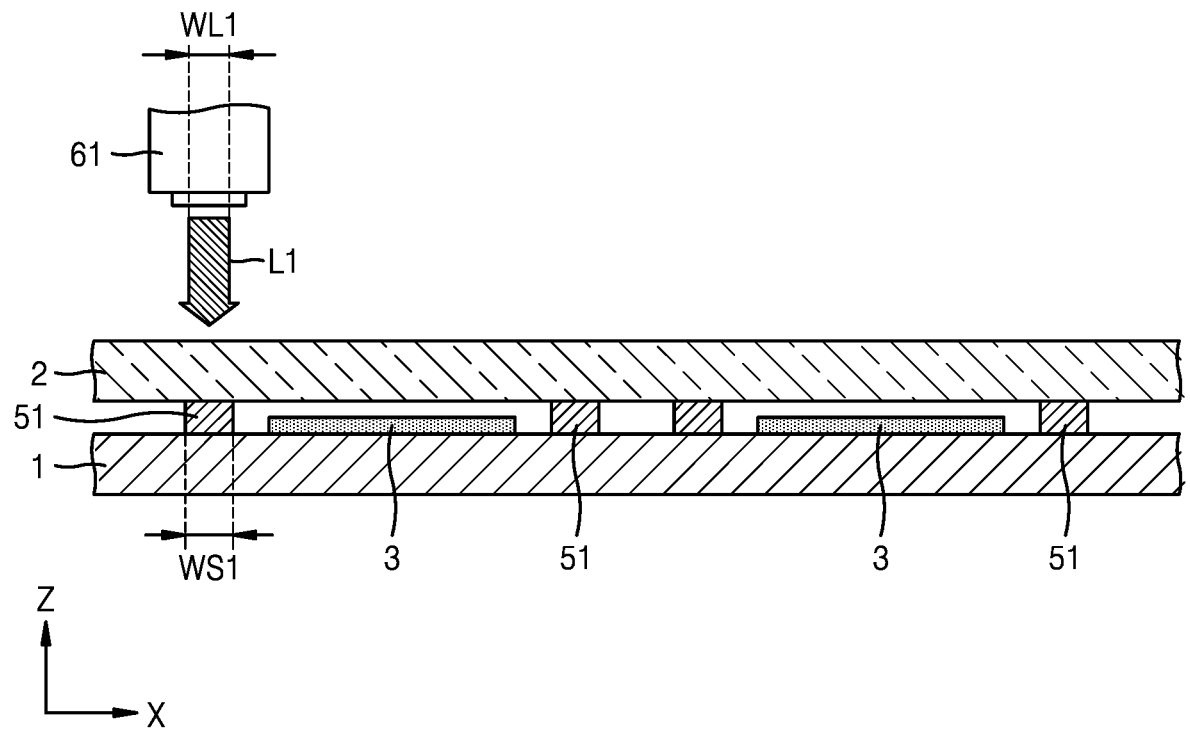
FIG. 3A is an enlarged schematic cross-sectional view of a region III of FIG. 2, in which a process of radiating a first laser beam is illustrated.
Figure 3B:
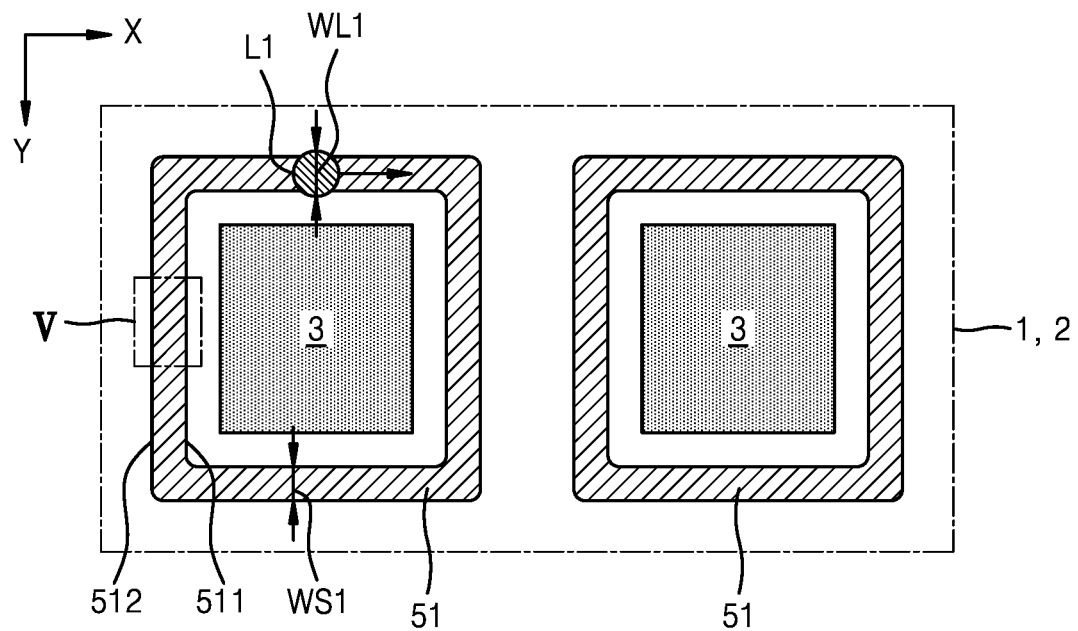
FIG. 3B is an enlarged schematic plan view of the region III of FIG. 2, in which a process of radiating the first laser beam is illustrated.

FIG. 2 is a schematic plan view illustrating a method of manufacturing the display apparatus according to an embodiment; FIG. 3A is an enlarged schematic cross-sectional view of a region III of FIG. 2, in which a process of radiating a first laser beam is illustrated; and FIG. 3B is an enlarged schematic plan view of the region III of FIG. 2, in which a process of radiating a first laser beam is illustrated.

Referring to FIG. 2, a first mother substrate 1 and a second mother substrate 2, which face each other, are prepared. Then, a plurality of displays 3 are formed on a surface of the first mother substrate 1 that is one of the first mother substrate 1 and the second mother substrate 2. A first sealed area 51 has a closed loop shape surrounding a periphery of each of the displays 3.

In an embodiment, the first mother substrate 1 and the second mother substrate 2 may include a transparent glass material, but are not limited thereto.

In an embodiment, each of the displays 3 includes a plurality of light-emitting diodes. According to an embodiment, the displays 3 may include a plurality of organic light-emitting diodes.

Figure 4:
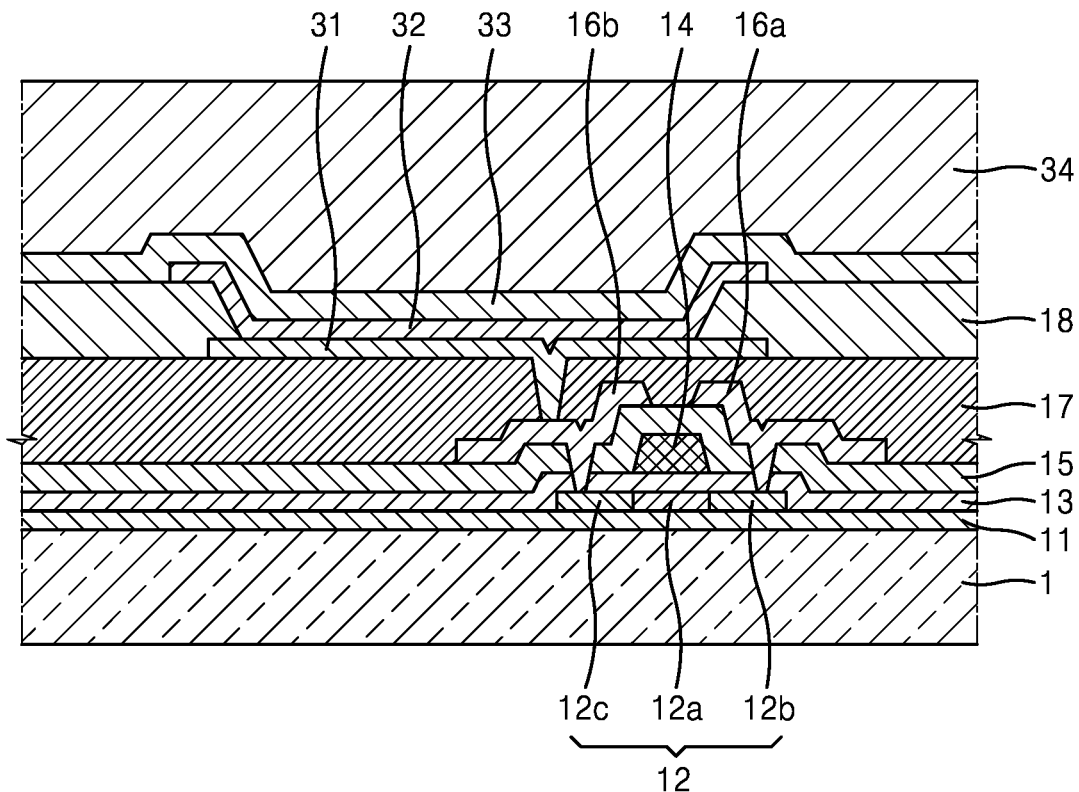
FIG. 4 is a cross-sectional view of an active matrix organic light-emitting diode as an example of a display.

FIG. 4 illustrates an active matrix organic light-emitting device as an example of the displays 3.

As shown in FIG. 4, an insulating layer 11, such as a barrier layer and/or a buffer layer, may be formed on an upper surface of the first mother substrate 1, wherein the insulating layer 11 is configured to prevent or substantially prevent the spread of an impurity ion to the first mother substrate 1, prevent or substantially prevent penetration of moisture or external air into the first mother substrate 1, and planarize a surface of the first mother substrate 1.

On the insulating layer 11, an active layer 12 of a thin-film transistor (TFT) is formed of a semiconductor material, and a gate insulating layer 13 is formed to cover the insulating layer 11 and the active layer 12. The active layer 12 may include an inorganic material semiconductor, such as amorphous silicon or polysilicon, or an organic semiconductor. The active layer 12 includes a source area 12b, a drain area 12c, and a channel area 12a therebetween.

On the gate insulating layer 13, a gate electrode 14 is arranged, and an interlayer insulating layer 15 is formed to cover the gate insulating layer 13 and the gate electrode 14. In addition, on the interlayer insulating layer 15, a source electrode 16a and a drain electrode 16b are arranged. Then, a planarization layer 17 and a pixel-defining layer 18 are sequentially arranged to cover the interlayer insulating layer 15, the source electrode 16a, and the drain electrode 16b.

The gate insulating layer 13, the interlayer insulating layer 15, the planarization layer 17, and the pixel-defining layer 18 may include insulating bodies and be formed to have a single-layered or multi-layered structure including an organic material, an inorganic material, or an organic/inorganic composite.

However, a stack structure of the TFT described above is not limited thereto, and any of various structures of the TFT may be adopted.

A pixel electrode 31 that is an electrode of the organic light-emitting diode is arranged on the planarization layer 17. The pixel-defining layer 18 is arranged on the planarization layer 17. An opening is formed in the pixel-defining layer 18 to thereby expose the pixel electrode 31. Then, an organic light-emitting layer 32 of the organic light-emitting diode is formed.

In an embodiment, the organic light-emitting diode displays image information by emitting red, green, blue, or white light according to current flow. The organic light-emitting diode includes the pixel electrode 31 in contact with the drain electrode 16b of the TFT via a contact hole, an opposite electrode 33 arranged to cover all pixels, and the organic light-emitting layer 32 arranged between the pixel electrode 31 and the opposite electrode 33 and configured to emit light.

The pixel electrode 31 is insulated from the opposite electrode 33 by the organic light-emitting layer 32. The pixel electrode 31 and the opposite electrode 33 apply voltages of different polarities to the organic light-emitting layer 32 such that the organic light-emitting layer 32 emits light.

In an embodiment, the organic light-emitting layer 32 may include a low-molecular weight organic film or a polymer organic film. When a low-molecular weight organic film is used, the organic light-emitting layer 32 may include a single-layered or multi-layered structure in which a hole injection layer (HIL), a hole transport layer (HTL), an emission layer (EML), an electron transport layer (ETL), an electron injection layer (EIL), etc. are stacked. The organic light-emitting layer 32 may include any of various organic materials, such as copper phthalocyanine (CuPc), N,N'-di(naphthalene-1-yl)-N,N'-diphenyl-benzidine (NPB), tris-8-hydroxyquinoline aluminum (Alq3), etc. Such a low-molecular weight organic film may be formed by using a vacuum deposition method. The HIL, the HTL, the ETL, the EIL, etc. are common layers, and may be applied in common to pixels of red, green, blue, or white light. In an embodiment, like the opposite electrode 33, the common layers may be formed to cover all pixels.

In an embodiment, the pixel electrode 31 functions as an anode electrode, and the opposite electrode 33 functions as a cathode electrode. However, polarities of the pixel electrode 31 and the opposite electrode 33 may be reversed from that described above.

When the display apparatus is a bottom-emission type apparatus in which an image is rendered in a direction toward the first mother substrate 1, the pixel electrode 31 may be a transparent electrode, and the opposite electrode 33 may be a reflective electrode. In this case, the pixel electrode 31 may be formed of indium tin oxide (ITO), indium zinc oxide (IZO), zinc oxide (ZnO), or indium oxide ($In_2O_3$), each having a high work function, and the opposite electrode 33 may be formed of metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), etc.

When a display apparatus is a bottom-emission type apparatus in which an image is rendered in a direction toward the opposite electrode 33, the pixel electrode 31 may include a reflective electrode, and the opposite electrode 33 may include a transparent electrode. In this case, the reflective electrode that is the pixel electrode 31 may be arranged to include a reflective layer formed of Ag, Mg, Al, Pt, Pd, Au, Ni, Nd, Ir, Cr, Li, Ca, or a compound thereof, and ITO, IZO, ZnO, $In_2O_3$, etc., each having a high work function. In addition, the transparent electrode that is the opposite electrode 33 may be formed by depositing metal having a low work function, that is, Ag, Mg, Al, Pt, Pd, Au, Ni, Nd, Ir, Cr, Li, Ca, or a compound thereof, and, then, forming an auxiliary electrode or a bus electrode line by using a transparent conductive material, such as ITO, IZO, ZnO, $In_2O_3$, etc.

In a case of a dual-emission type display apparatus, both the pixel electrode 31 and the opposite electrode 33 may include a transparent electrode.

However, the pixel electrode 31 and the opposite electrode 33 are not limited to the materials described above. In an embodiment, the pixel electrode 31 and the opposite electrode 33 may be formed of a conductive organic material, a conductive paste including conductive particles, such as Ag, Mg, Cu, etc. When such a conductive paste is used, the conductive paste may be printed by using an inkjet printing method, and, after the printing, the conductive paste may be sintered to be thereby formed as an electrode.

On an upper surface of the opposite electrode 33 of the displays 3 manufactured as described above, a passivation layer 34 may be further included to cover the displays 3.

The passivation layer 34 may include at least one organic layer and/or at least one inorganic layer.

The inorganic layer may include one or more inorganic insulating materials selected from aluminum oxide, titanium oxide, tantalum oxide, hafnium oxide, zinc oxide, silicon oxide, silicon nitride, and silicon oxynitride. The inorganic layer may be formed by using a chemical vapor deposition (CVD) method, etc.

The organic layer may include polyethylene terephthalate, polyethylene naphthalate, polycarbonate, polyimide, polyethylene sulfonate, polyoxymethylene, polyarylate, hexamethyldisiloxane, acrylic-based resin (e.g., polymethyl methacrylate, polyacrylic acid, etc.), or a combination thereof.

As shown in FIG. 2, m displays 3 in a first direction (e.g., an X-direction) and n displays in a second direction (e.g., a Y-direction) are arranged. Although not illustrated in FIG. 2, a pad unit connecting each of the displays 3 to an external device may be further arranged in a periphery of each of the displays 3. In this case, a display 3 and a pad unit (not shown) may constitute one unit cell. Respective unit cells are arranged to be adjacent to each other.

In addition, the first sealed area 51 surrounding each of the displays 3 is formed. In an embodiment, a frit in a paste state is applied to a surface of the second mother substrate 2 facing the first mother substrate 1 and, then, primarily pre-sintered to thereby harden the frit. However, the first sealed area 51 including the frit may be formed on a surface of the first mother substrate 1 facing the second mother substrate 2. In an embodiment, the first sealed area 51 including the frit may be formed on both a surface of the second mother substrate 2 facing the first mother substrate 1 and a surface of the first mother substrate 1 facing the second mother substrate 2. The frit in the paste state may be applied sequentially to each of the unit cells by using a dispenser or applied to each of the unit cells together by using a screen printing method.

Referring to FIGS. 3A and 3B, after the second mother substrate 2 and the first mother substrate 1 are aligned, wherein the first sealed area 51 including the frit is formed on the second mother substrate 2 and the first mother substrate 1, a first laser beam L1 having a first width WL1 is radiated toward the first sealed area 51 through a first laser radiator 61 to thereby bond the first mother substrate 1 to the second mother substrate 2.

The first width WL1 of the first laser beam L1 may be approximately the same as a first width WS1 of the first sealed area 51. Although not illustrated in FIGS. 3A and 3B, a mask in which an opening is formed may be arranged between the first laser radiator 61 and the first sealed area 51, and the first laser beam L1 may be radiated toward the first sealed area 51 through the opening of the mask. The first width WL1 of the first laser beam L1 may be a width of a laser beam having passed through the opening.

In FIG. 3A, the first laser beam L1 is shown radiated from above the second mother substrate 2. However, the radiation of the first laser beam L1 is not limited thereto. In an embodiment, the first laser beam L1 may be radiated from below the first mother substrate 1, or radiated (e.g., at the same time) from above the second mother substrate 2 and below the first mother substrate 1.

A laser that may melt the frit may be used as the first laser beam L1. For example, the first laser beam L1 may be a continuous wave (CW) laser beam that has Gaussian distribution characteristics and may continuously oscillate at a constant output.

However, when a substrate is sealed by melting the frit by using the CW laser beam having Gaussian distribution characteristics, uniformity in both a thickness of the frit and a bonding surface may deteriorate, and, thus, a problem such as generation of cracks in a bonding surface between the frit and the substrate may occur.

Figure 5:
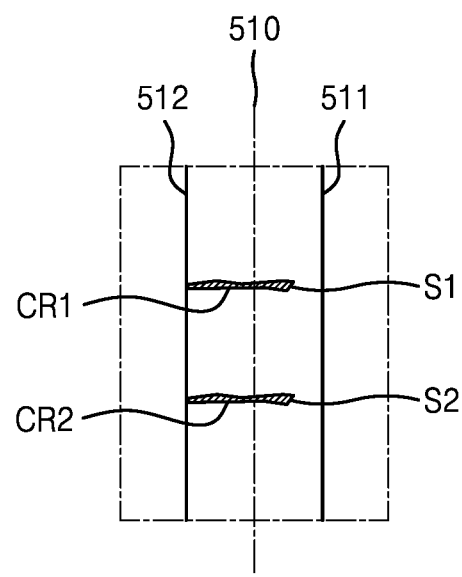
FIG. 5 is an enlarged view of a region V of FIG. 3B.

FIG. 5 is an enlarged view of a region V of FIG. 3B.

Referring to FIG. 5, it may be understood that a plurality of first and second cracks CR1 and CR2 may occur in the first sealed area 51. The first sealed area 51 includes a first end 511 arranged near or proximate the displays 3 and a second end 512 arranged away or distal from the displays 3. It may be understood that starting points S1 and S2 of the first and second cracks CR1 and CR2 begin from inside of the first sealed area 51 and are spread to the second end 512 of the first sealed area 51. When the starting points S1 and S2 of the first and second cracks CR1 and CR2 are viewed from a virtual center line 510 of the first sealed area 51, the starting points S1 and S2 of the first and second cracks CR1 and CR2 may be formed nearer the first end 511 than the second end 512.

As such, as a plurality of first and second cracks CR1 and CR2 occur in the first sealed area 51, a strength of an instrument may worsen when an external shock is applied to the instrument and a defect in the display apparatus may be caused by penetration of moisture into the display apparatus. In the present embodiment, to solve such a problem, by radiating a second laser beam L2 toward an inside of the first sealed area 51 in which the starting points S1 and S2 of the first and second cracks CR1 and CR2 are intensively distributed, the frit and the first and second mother substrates 1 and 2 are melted in an area in which the starting points S1 and S2 of the first and second cracks CR1 and CR2 are formed to thereby secondly bond the frit to the first and second mother substrates 1 and 2.

Figure 6A:
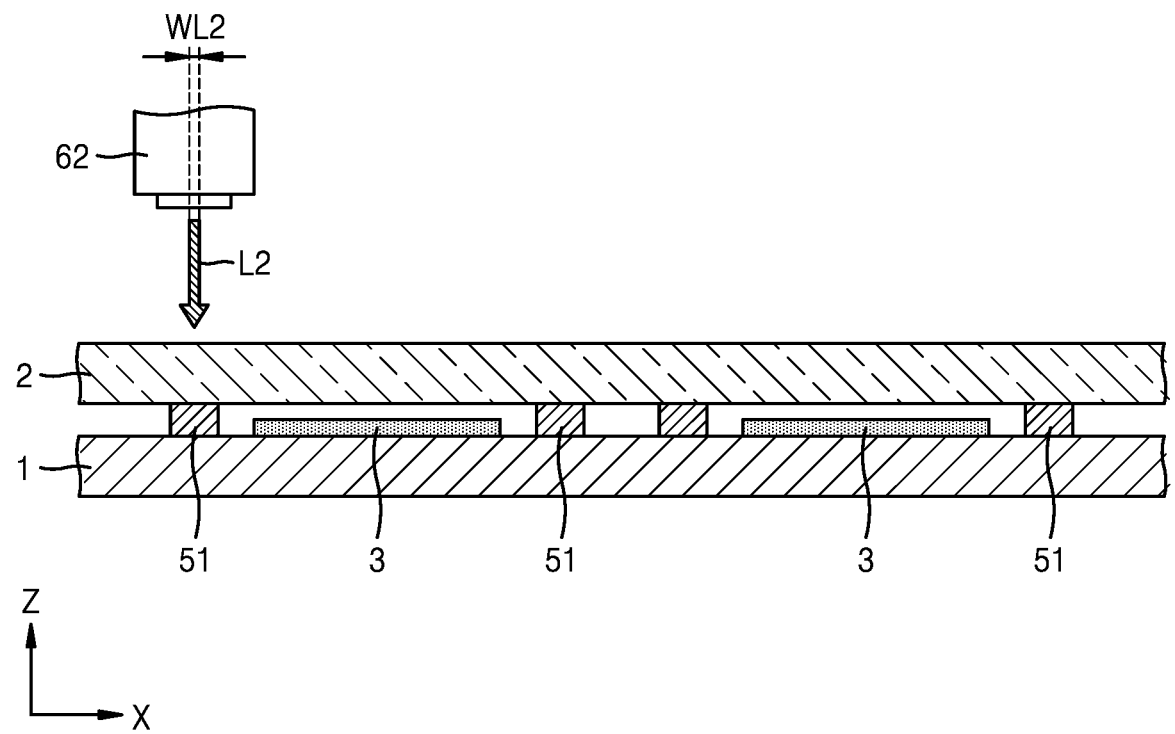
FIG. 6A is a schematic cross-sectional view illustrating a process of radiating a second laser beam.
Figure 6B:
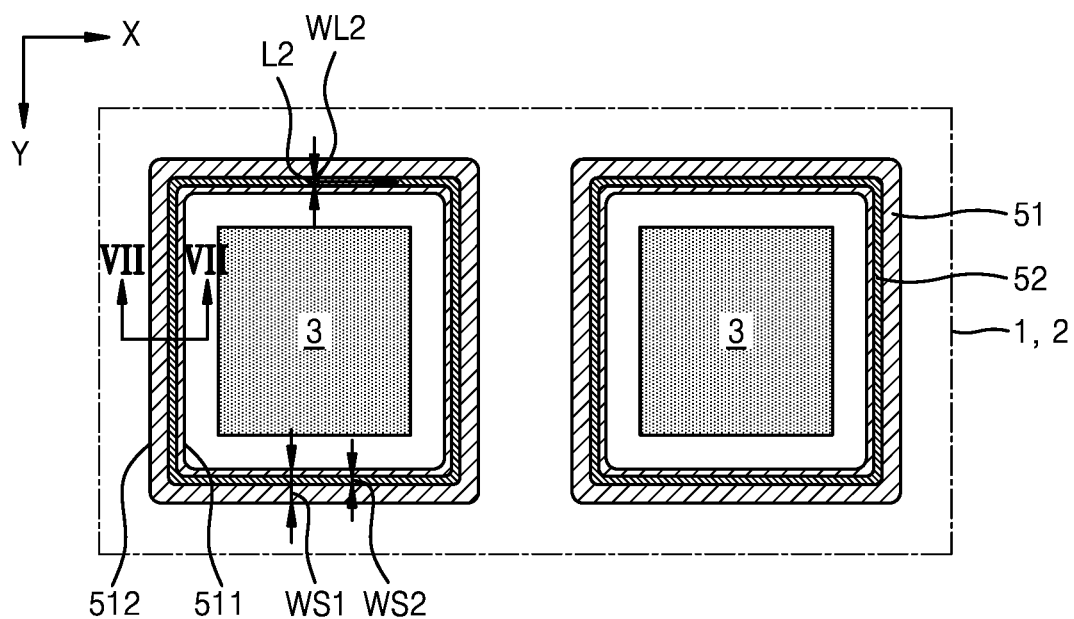
FIG. 6B is a schematic plan view illustrating a process of radiating the second laser beam.

FIG. 6A is a schematic cross-sectional view illustrating a process of radiating the second laser beam L2; and FIG. 6B is a schematic plan view illustrating a process of radiating the second laser beam L2.

Referring to FIGS. 6A and 6B, the second laser beam L2 having a second width WL2 is radiated toward an inside of the first sealed area 51 through a second laser radiator 62 to thereby form a second sealed area 52 in which the frit and the first mother substrate 1, and/or the frit and the second mother substrate 2 are melted and mixed with each other.

The second width WL2 of the second laser beam L2 may be approximately the same as a second width WS2 of the second sealed area 52. Although not illustrated in FIGS. 6A and 6B, a mask in which an opening is formed may be arranged between the second laser radiator 62 and the second sealed area 52, and the second laser beam L2 may be radiated toward the second sealed area 52 through the opening of the mask. The second width WL2 of the second laser beam L2 may be a width of a laser beam having passed through the opening.

In FIG. 6A, the second laser beam L2 is shown radiated from above the second mother substrate 2. However, the radiation of the second laser beam L2 is not limited thereto. In an embodiment, the second laser beam L2 may be radiated from below the first mother substrate 1, or radiated (e.g., at the same time) from above the second mother substrate 2 and below the first mother substrate 1.

The second laser beam L2 may have high energy such that, while heat generation in the frit is greatly reduced, the frit and the first mother substrate 1, and/or the frit and the second mother substrate 2 are melted together. For example, the second laser beam L2 may be a femtosecond laser.

By melting at least one of the first and second mother substrates 1 and 2 by using the second laser beam L2, the second sealed area 52 includes an area in which the frit is mixed with materials of at least one of the first and second mother substrates 1 and 2.

On a bonding surface on which the first sealed area 51 is bonded to the first and second mother substrates 1 and 2, a boundary between the first sealed area 51 and the first and second mother substrates 1 and 2 may be shown as a flat surface to distinguish the first sealed area 51 from the first and second mother substrates 1 and 2. However, on a bonding surface of the second sealed area 52 on which the frit is bonded to the first and second mother substrates 1 and 2, a boundary between the frit and the first and second mother substrates 1 and 2 may not be clear. For example, on a bonding surface of the second sealed area 52 on which the frit is bonded to the first and second mother substrates 1 and 2, two materials of the frit and at least one of the first and second mother substrates 1 and 2, respectively, may be melted and mixed with each other, and, thus, a protruding shape may be formed instead of a flat shape at a boundary between the frit and at least one of the first and second mother substrates 1 and 2.

Figure 7:
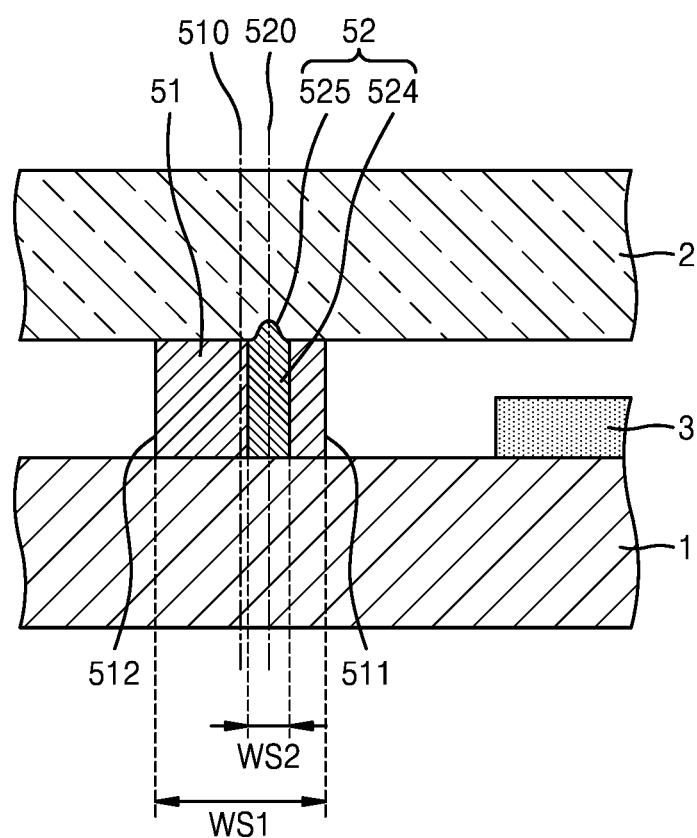
FIG. 7 is a cross-sectional view of the display apparatus taken along the line VII-VII of FIG. 6B.

FIG. 7 is a cross-sectional view of the display apparatus taken along the line VII-VII of FIG. 6B.

Referring to FIG. 7, the second sealed area 52 includes a first portion 524 in the first sealed area 51, and a protruding portion 525 protruding in a direction toward the second mother substrate 2.

The first sealed area 51 includes the first end 511 arranged near the displays 3 and the second end 512 arranged away from the displays 3. The first portion 524 of the second sealed area 52 is arranged between the first end 511 and the second end 512 of the first sealed area 51. The second width WS2 of the second sealed area 52 is less than the first width WS1 of the first sealed area 51.

As described above with reference to FIG. 5, since the second laser beam L2 is radiated toward an area in which the starting points S1 and S2 of the first and second cracks CR1 and CR2 are intensively distributed, a center 520 of the second sealed area 52 may be formed nearer to the first end 511 than to the second end 512. In an embodiment, the center 520 of the second sealed area 52 may be arranged between a point corresponding to ¼ of the first width WS1 of the first sealed area 51 from the first end 511 and a point corresponding to ½ of the first width WS1 of the first sealed area 51 from the first end 511. However, the present disclosure is not limited thereto. For example, when the starting points S1 and S2 of the first and second cracks CR1 and CR2 are arranged near the second end 512 of the first sealed area 51, the center 520 of the second sealed area 52 may be arranged nearer to the second end 512 than the first end 511. As such, the center 520 of the second sealed area 52 is not limited to a particular point in the first sealed area 51.

In FIG. 7, on a bonding surface on which the first sealed area 51 is bonded to the first and second mother substrates 1 and 2, a boundary between the first sealed area 51 and the first and second mother substrates 1 and 2 may be shown as a flat surface. However, on a bonding surface of the second sealed area 52 on which the frit is bonded to the second mother substrate 2, two materials of the frit and the second mother substrate 2, respectively, may be melted and mixed with each other. Thus, the protruding portion 525 may be formed at a boundary between the frit and the second mother substrate 2. That is, when the second sealed area 52 is viewed from a surface vertical to a main surface of the second mother substrate 2, the second sealed area 52 is arranged to include the protruding portion 525 protruding from a surface on which the frit is in contact with the second mother substrate 2 toward the second mother substrate 2.

The protruding portion 525 is shown in FIG. 7 having a curved shape. However, this is only an example. Here, the protruding portion 525 may indicate a curve caused when a boundary surface between materials having different melting points collapses, unlike a boundary surface between the first sealed area 51 and the second mother substrate 2 which is identified as a flat surface. This indicates that a portion of the curve may protrude toward the second mother substrate 2. The protruding portion 525 may remarkably reduce a speed at which an external shock spreads, compared to a flat portion.

Figure 8:
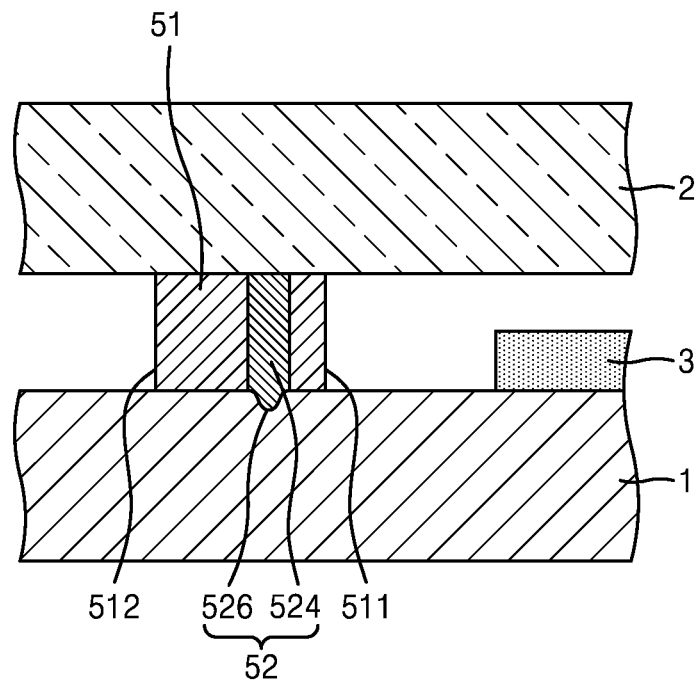
FIG. 8 is a cross-sectional view illustrating a second sealed area according to an embodiment.
Figure 9:
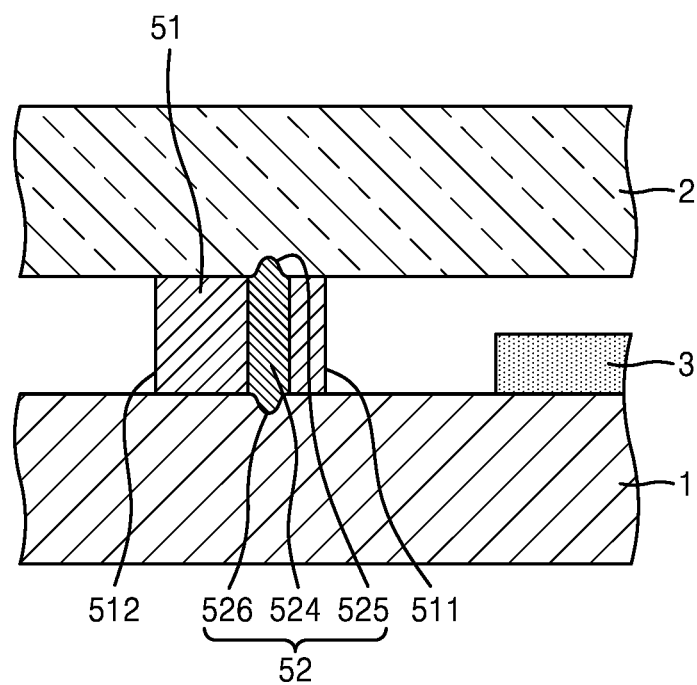
FIG. 9 is a cross-sectional view illustrating a second sealed area according to an embodiment.

FIGS. 8 and 9 are cross-sectional views illustrating embodiments of the second sealed area 52.

Referring to FIG. 8, a first portion 524 of the second sealed area 52 is located in the first sealed area 51, and arranged nearer to the first end 511 than to the second end 512 of the first sealed area 51. When the second sealed area 52 is viewed from a surface vertical to a main surface of the first mother substrate 1, the second sealed area 52 is arranged to include a portion 526 protruding from a surface on which the frit is in contact with the first mother substrate 1 toward the first mother substrate 1.

Referring to FIG. 9, the first portion 524 of the second sealed area 52 is located in the first sealed area 51, and arranged nearer to the first end 511 than to the second end 512 of the first sealed area 51.

When the second sealed area 52 is viewed from a surface vertical to a main surface of the first mother substrate 1, the second sealed area 52 is arranged to include the portion 526 protruding from a surface on which the frit is in contact with the first mother substrate 1 toward the first mother substrate 1, and when the second sealed area 52 is viewed from a surface vertical to a main surface of the second mother substrate 2, the second sealed area 52 is arranged to include the protruding portion 525 protruding from a surface on which the frit is in contact with the second mother substrate 2 toward the second mother substrate 2.

Figure 10:
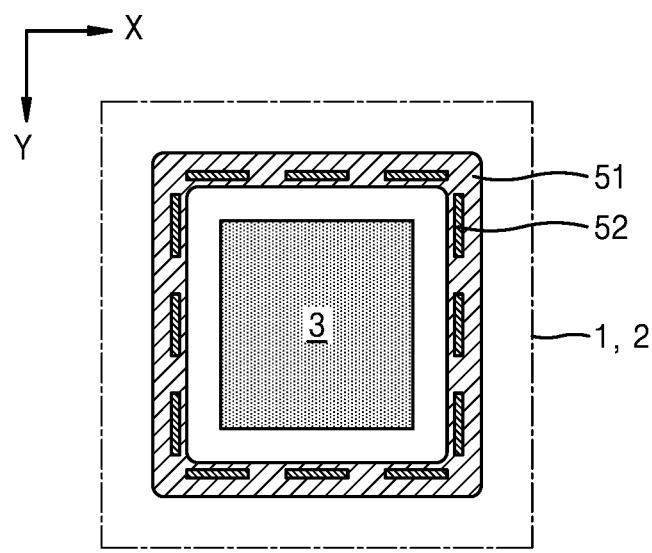
FIG. 10 is a plan view illustrating a second sealed area according to an embodiment.

FIG. 10 is a plan view illustrating another embodiment of the second sealed area 52.

A display 3 is arranged between the first mother substrate 1 and the second mother substrate 2. The first sealed area 51 is arranged to surround the display 3 and include a frit. The second sealed area 52 shown in FIG. 6B is formed in the first sealed area 51 continuously in a closed loop shape. On the other hand, the second sealed area 52 shown in FIG. 10 may be formed in the first sealed area 51 discontinuously.

Figure 11:
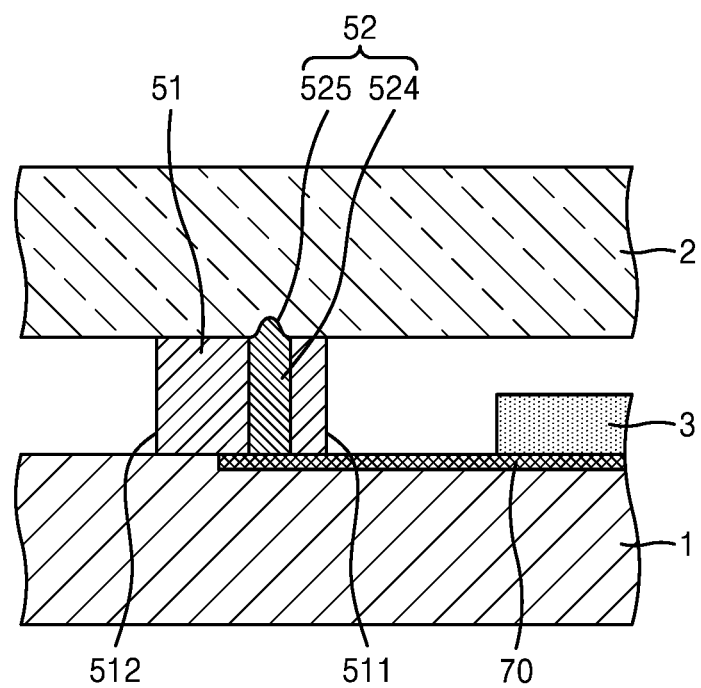
FIG. 11 is a cross-sectional view illustrating a second sealed area according to an embodiment.

FIG. 11 is a cross-sectional view illustrating another embodiment of the second sealed area 52.

Referring to FIG. 11, the first portion 524 of the second sealed area 52 is located in the first sealed area 51, and arranged nearer to the first end 511 than to the second end 512 of the first sealed area 51.

The second sealed area 52 includes the protruding portion 525 protruding toward the second mother substrate 2. A metal layer 70 is arranged between the second sealed area 52 and the first mother substrate 1, and between the first sealed area 51 and the first mother substrate 1.

In an embodiment, the metal layer 70 may include a same material as that of a wire, an electrode, etc. used for the display 3. The metal layer 70 may be utilized to rapidly increase a temperature of the first mother substrate 1 by converting energy received from a first laser beam to heat.

In an embodiment, the metal layer 70 may be melted with a frit by using energy received from a second laser beam. Thus, although not illustrated in FIG. 11, the second sealed area 52 may further include a portion protruding toward the metal layer 70.

As described above, according to various embodiments, starting points of cracks may be removed by melting and mixing a frit and a substrate with each other by radiating the second laser beam L2 toward an area in which starting points of cracks are intensively distributed in the first sealed area, and a protruding portion may be formed by melting and mixing a frit and a substrate with each other at a boundary between the frit and the substrate, to thereby reduce a speed at which an external shock is spread.

Figure 12:
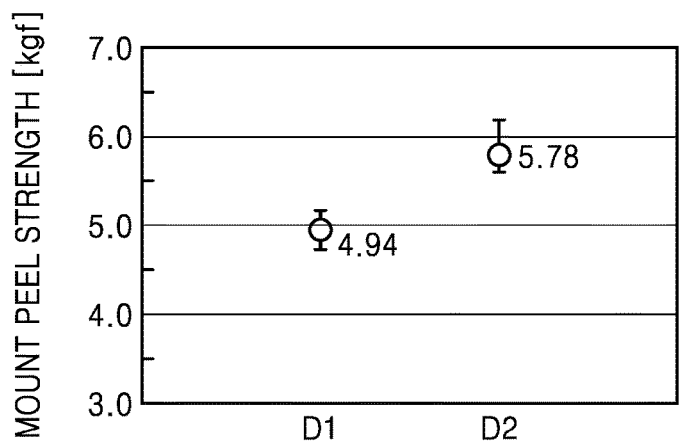
FIG. 12 is a graph for comparing a bonding strength between a first sample and a second sample.

FIG. 12 is a graph for comparing a bonding strength between a first sample D1 and a second sample D2.

Referring to FIG. 12, a peel strength of the first sample D1 that does not include the second sealed area 52 is 4.94 kgf, whereas a peel strength of the second sample D2 including the second sealed area 52 is 5.78 kgf, which is an increase by about 17% compared to that of the first sample D1. That is, it may be understood that a bonding strength of the second sample D2 is increased.

Figure 13:
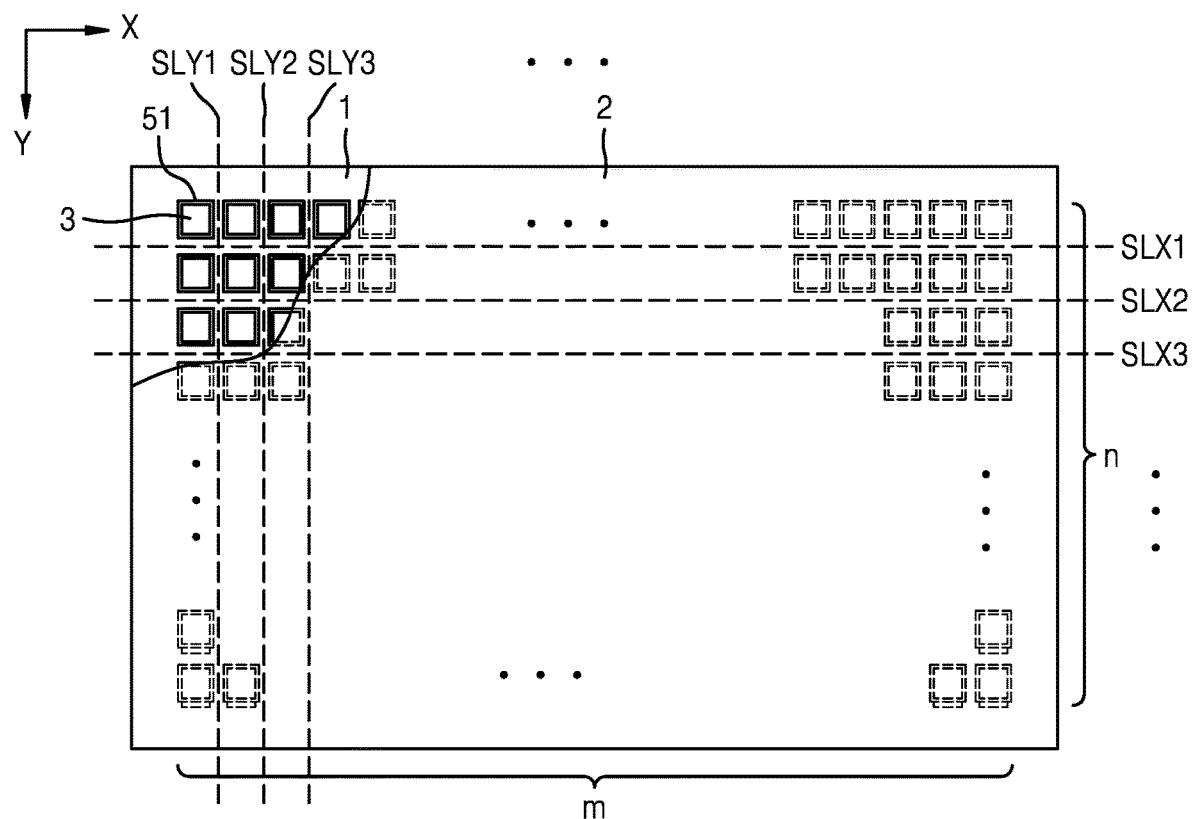
FIG. 13 is a diagram illustrating an operation in which a plurality of displays are divided into unit cells by cutting first and second mother substrates.

FIG. 13 is a diagram illustrating an operation in which a plurality of the displays 3 are divided into unit cells by cutting the first and second mother substrates 1 and 2.

Referring to FIG. 13, the plurality of displays 3 may be divided into unit cells by cutting the first and second mother substrates 1 and 2 by using a cutter, a laser, etc. along a plurality of first scribing lines SLX1, SLX2, and SLX3 and a plurality of second scribing lines SLY1, SLY2, and SLY3, wherein the first scribing lines SLX1, SLX2, and SLX3 extend in a first direction (e.g., the X-direction) and the second scribing lines SLY1, SLY2, and SLY3 extend in a second direction (e.g., the Y-direction).

In the above-described embodiments, a process of forming the second sealed area by radiating a second laser beam may be performed for respective unit cells after dividing the displays 3 into the unit cells, as shown in FIG. 13.

According to embodiments, starting points of cracks may be removed by melting and mixing a frit and a substrate with each other by radiating a second laser beam toward an area in which starting points of cracks may be intensively distributed in a first sealed area, and a protruding portion may be formed by melting and mixing a frit and a substrate with each other at a boundary between the frit and the substrate, to thereby reduce a speed at which an external shock is spread. However, the aspects and effects described above are only examples.

It is to be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
   a first substrate;
   a display arranged on the first substrate and comprising a light-emitting diode;
   a second substrate facing the first substrate;
   a first sealed area arranged between the first substrate and the second substrate, surrounding the display, and comprising a frit; and
   a second sealed area arranged in the first sealed area and comprising at least one portion protruding toward the first substrate and/or the second substrate, the at least one portion comprising an area in which materials of the frit and the first substrate, and/or materials of the frit and the second substrate are melted and mixed with each other.

2. The display apparatus of claim 1, wherein the first substrate and/or the second substrate comprises a glass material.

3. The display apparatus of claim 1, wherein the first sealed area has a closed loop shape surrounding a periphery of the display.

4. The display apparatus of claim 1, wherein
   the first sealed area comprises a first end arranged proximate the display, and a second end arranged far from the display, and
   a center of the second sealed area is nearer to the first end than to the second end.

5. The display apparatus of claim 4, wherein the center of the second sealed area is between a point corresponding to ¼ of a width of the first sealed area from the first end and a point corresponding to ½ of the width of the first sealed area from the first end.

6. The display apparatus of claim 1, wherein a width of the second sealed area is less than a width of the first sealed area.

7. The display apparatus of claim 1, wherein the second sealed area is formed continuously in the first sealed area.

8. The display apparatus of claim 1, wherein the second sealed area is formed discontinuously in the first sealed area.

9. The display apparatus of claim 1, wherein the at least one portion comprises first and second portions respectively protruding toward the first substrate and the second substrate and respectively comprising the area in which the materials of the frit and the first substrate and the materials of the frit and the second substrate are melted and mixed with each other.

10. The display apparatus of claim 1, wherein the at least one portion protruding toward the first substrate and/or the second substrate has a curved shape.

11. The display apparatus of claim 1, further comprising a metal layer between the second sealed area and the first substrate.

12. The display apparatus of claim 4, wherein the first sealed area is bonded to the first substrate and the second substrate from the first end to the second end.

* * * * *